United States Patent
Mei et al.

(10) Patent No.: US 8,994,916 B2
(45) Date of Patent: Mar. 31, 2015

(54) DOUBLE-SIDED MASKLESS EXPOSURE SYSTEM AND METHOD

(76) Inventors: Wenhui Mei, Plano, TX (US); Weichong Du, Burnaby (CA); Lujie Qu, Shenzhen (CN)

(*) Notice: Subject to any disclaimer, the term of this patent is extended or adjusted under 35 U.S.C. 154(b) by 260 days.

(21) Appl. No.: 13/523,924

(22) Filed: Jun. 15, 2012

(65) Prior Publication Data

US 2013/0044300 A1  Feb. 21, 2013

Related U.S. Application Data

(60) Provisional application No. 61/523,742, filed on Aug. 15, 2011.

(30) Foreign Application Priority Data

May 21, 2012 (CN) .......................... 2012 1 0159451

(51) Int. Cl.
*G03F 7/20* (2006.01)
*G03F 9/00* (2006.01)

(52) U.S. Cl.
CPC .......... *G03F 7/2032* (2013.01); *G03F 7/70275* (2013.01); *G03F 7/2057* (2013.01); *G03F 7/70425* (2013.01); *G03F 9/00* (2013.01); *G03F 9/7088* (2013.01)
USPC .................. 355/26; 355/67; 355/68; 355/70; 355/77; 356/399; 356/400

(58) Field of Classification Search
CPC ... G03F 7/2032; G03F 7/2051; G03F 7/2075; G03F 7/70275; G03F 7/70291; G03F 7/70425; G03F 7/70466; G03F 9/00; G03F 9/7088
USPC ............ 355/26, 67, 68, 70, 77; 356/399–401, 356/615
See application file for complete search history.

(56) References Cited

U.S. PATENT DOCUMENTS

| 3,937,579 | A | | 2/1976 | Schmidt |
| 4,685,807 | A | * | 8/1987 | Picard ........................... 356/401 |
| 5,148,214 | A | * | 9/1992 | Ohta et al. ...................... 355/43 |
| 5,285,236 | A | | 2/1994 | Jain |
| 5,337,151 | A | | 8/1994 | Baxter |
| 5,604,354 | A | | 2/1997 | Lauverjat |
| 5,923,403 | A | | 7/1999 | Jain |
| 5,933,216 | A | | 8/1999 | Dunn |
| 6,211,942 | B1 | | 4/2001 | Okamoto |
| 6,356,337 | B1 | | 3/2002 | Zemel |
| 7,932,993 | B2 | | 4/2011 | Mei |
| 2002/0097475 | A1 | | 7/2002 | Mei |
| 2005/0128450 | A1 | * | 6/2005 | Schroeder ...................... 355/53 |
| 2009/0279057 | A1 | | 11/2009 | Kim |

* cited by examiner

*Primary Examiner* — Colin Kreutzer

(57) ABSTRACT

A double-sided maskless exposure system and method consists of light sources which includes two light wavelength segments, maskless optical engines in which a 2D spatial light modulation (spatial light modulator) device, such as DMD, is generating a plurality of pixel array of the pattern, vision system, moving substrate and computer control system. The double-sided maskless exposure system at least includes two maskless optical engines with auto-calibration function which can correct any alignment error in-line. Each optical engine is for each side of the substrate. The optical engines are aligned each other in pairs and are simultaneously patterning on each side of the moving substrate. The system also includes a manipulator for moving, stepping or scanning the optical engines, relative to the substrate so that it can create a contiguous whole image on the both sides of the subject.

19 Claims, 17 Drawing Sheets

Fig. 2 – Prior Art

DOUBLE-SIDED MASKLESS EXPOSURE SYSTEM AND METHOD

CROSS REFERENCE TO RELATED APPLICATIONS

The present patent application is related to and claims the benefit of provisional patent application No. 61/523,742, filed on Aug. 15, 2011, entitled DOUBLE SIDE MASKLESS EXPOSURE SYSTEM, the entire contents of which is enclosed by reference herein.

BACKGROUND

The method and system are generally related to maskless lithography or direct-write digital image technologies. More specifically, it relates to a double-sided maskless exposure system capable of simultaneously exposing both surfaces of a subject plate, such as a substrate for a printed circuit board (PCB) or a sheet for lead frames. The system disclosed herein could be used to create double side exposures for PCB, IC packaging and LCD manufacturing. It could also include applications such as document printing and photographic reproduction etc. The following description focuses on PCB exposure equipment, although the specification can be applied by obvious extension to other fields of use as well.

The current PCB exposure industry mainly uses film masks. The technology suffers many disadvantages, e.g., film deformation, low alignment accuracy, limited line width around 4 millimeter, and difficulties in film storage and management etc. With the PCB industry moving towards high-density interconnection (HDI) board, multi-layered board and other trends, along with rising demands for high precision alignment, the traditional film mask (Mask) exposure lithography process is limited by the technical production bottleneck. To solve the yield and productivity problems, the PCB industry has paid more attention to the emerging maskless lithography technology or the direct imaging equipment (Direct-write Digital Imaging System). The maskless lithography technology is expected to grow into a mainstream technology in lithography. Conventional film mask lithography for PCB is relatively cheap but cannot overcome many problems such as the distortion between PCB layers and the scaling issue. The development of HDI multilayer and high-density boards highlights the many advantages of using the maskless technology. The technology enjoys at a high exposure speed on the traditional dry film photo-resist with distortion correction. A direct-write digital imager can achieve high output (high throughput), high yield, yet with the lowest overall cost. This new kind of PCB maskless exposure equipment is gaining popularity in the industry.

The method and system also relates to double-sided exposure systems examples of which include U.S. Pat. No. 5,337,151, U.S. Pat. No. 5,627,378, U.S. Pat. No. 5,923,403, U.S. Pat. No. 5,929,973, U.S. Pat. No. 5,933,216 and U.S. Pat. No. 6,211,942. The technology requires masks for imaging patterns onto photo resist coated sides of a subject. The subject plate may include, for example, a semiconductor substrate for manufacture of integrated circuits, metal substrate for etched lead frame manufacture, conductive plate for printed circuit board manufacture, or the like. A patterned mask or photo mask may include, for example, a plurality of lines, structures, or images. With conventional photolithography, the patterned masks or films for high resolution applications are typically very expensive and have a short lifetime. In addition, photomasks often require a long mask purchase lead time. The long mask purchase lead time creates a roadblock when a short product development cycle is desired. Further, when a particular mask design requires a design change in the pattern, regardless the size of the change, it requires a long lead time and associated mask modification cost. Frequent mask modifications can cause serious problems in PCB manufacturing.

A double-sided maskless exposure system is also advantageous over single side maskless exposure systems. Most PCBs need exposure on both sides. A single side maskless exposure system doubles the exposure for exposure on both sides of the board and requires additional alignment process to align the patterns on both sides. Poor alignment often reduces system productivity and yield. A double-sided maskless exposure system, however, does not require pattern alignment and is compatible with the conventional double-sided exposure equipment and other processes. It works especially well for flexible exposure subjects such as a lead frame. A lead frame is fed in a roll. The continuous exposure required for a lead frame make it difficult to use a single side maskless exposure system due to required pattern alignment process for both sides. It would require multiple pieces of equipment, which comes with higher cost.

A double side maskless system (U.S. Pat. No. 6,396,561, US2009/0279057) is apparently a better choice than a single side maskless exposure system. The key is how to achieve desired system stability and reliability after adding another side maskless exposure mechanism. There are at least two maskless optical engines in a double-sided exposure system, the distance between them is often too far to get accurate alignment of the two optical engines. Even if the maskless optical systems were aligned in fabrication, it could easily change due to vibration, temperature change, and other environmental condition. An auto-calibration system or self-check function is necessary to ensure the alignment of both sides and exposure quality.

There are currently a few types of double-sided maskless exposure systems in the market. One uses a laser beam scanning on a substrate surface; another is called direct imaging, which uses a 2D Spatial Light Modulation (SLM), such as Digital Mirror Device (DMD) to project a pixel array on a substrate. The system disclosed herein relates to the direct imaging method. When using the direct imaging method, each of the plurality of pixel elements of SLM is simultaneously focused on portions of the subject plate. The subject and pixel elements are then moved (e.g., by vibrating one or both the subject and pixel elements), and the sub-pattern is changed in response to the movement and the SLM pixel pattern. As a result, UV light can be projected into the sub-pattern to create the plurality of pixel elements on the subject, and the pixel elements can be moved and altered, according to the pixel-mask pattern, to create a contiguous image on the subject. In a 2D direct imaging method, there are three generations of maskless optical engines; the first generation is to directly image a 2D SLM on a substrate with enlarging or shrinking pixel size without any transformation. The second generation is called the point array method, which uses micro-lens to focus the light from each pixel and get the focus points on a substrate surface. The third generation is called sub-image array method, which uses a special optical system to divide the image of the whole 2D SLM into a sub-images array with shrinking pixel size on the substrate. The difference between the three generations is the imaging optical system.

SUMMARY

The method and system disclosed herein aim to solve the problems associated with the current designs as described above, and an objective of the present apparatus and method is to provide an optical and mechanical system that can expose the both sides of a subject plate without masks.

The present system is a double-sided maskless exposure system, which includes a UV light source, a spatial light modulator (SLM), an optical systems, a motion system, a vision system, control circuits, data conversion and data processing software and computer system. Using the present system, double-sided pattern data generated by a computer are imaged by at least one maskless optical system (maskless optical engine) for each side of the moving substrate, through a spatial light modulator (SLM), such as DMD, LCOS, LCD and other 2D display panels. It can also be arranged to use more optical engines to expose a large area within the same exposure time period.

The present system overcomes the many disadvantages of a conventional double exposure systems and improve productivity and quality. A technical advance is achieved by a novel optical system and method for photolithography. It produces a digital image from a pixel panel onto specific sites on a subject plate using a vision system to detect alignment errors between a pair of the optical engines on both sides of the plate. In one embodiment, the system includes a panel for generating the pattern and for creating a plurality of pixel elements on the substrate. A vision system is provided and positioned co-axial with the optical engine and monitors the position of the panel position in the optical engines. The function of the vision system is to align the optical systems on the both sides of the substrate and also align exposure pattern with the substrate position.

In order to achieve the objectives described above, a first aspect of the present system includes: a substrate with photo sensitive material on both sides for exposure; two maskless optical engines that are separately set in each side of the substrate; one exposure light source for each optical engine, or one light source shared by the two optical engines through a beam splitter; a vision system with a calibration light source and the light wavelength thereof is different from exposure light source and not sensitive to the photo sensitive material on the substrate; the vision system is mounted with one of the maskless optical engines, and its optical axis is aligned with the maskless optical system axis thru a beam splitter; the beam splitter is mostly transparent for the exposure light and about 50% reflective for the vision system light; the focus plane position of the vision system is same as the maskless optical engine; a XY motion stage controlled by a control system and synchronized with the maskless optical engines, and the stage can make relative movement between maskless optical engines and the substrate; the stage is transparent on the exposure area which allows exposure light to reach the substrate or plate; each maskless optical engine has an individually controlled Z stage to change the distance between the maskless optical engine and substrate. In the auto-calibration process, the substrate is not put on the stage, and the two maskless optical engines are already pre-aligned at the time of design and fabrication, or by the control system. First, the system sends the alignment pattern to each engine and turn on the exposure light source with proper light intensity. Second, it adjusts each optical engine's Z position to focus each alignment pattern on the stage surface, which is transparent and also reflect a little bit light from the surface. Therefore one of pattern is reflected back to the vision system, and the light from another maskless optical engine passes through the stage surface into the vision system. Then the vision system can have both of alignment patterns in the camera and read each alignment position to get the distance between the two optical engines. This position data will be saved in the computer system for data correction during the exposure process. In the exposure process, the exposure light sources are initially off, and the vision system calibration light source is on. The second step is to put the substrate on the stage. If the substrate has no pattern on the surfaces, the system can directly do exposure with the corrected data saved in the computer. If there is an existing pattern on the substrate surface, the vision system reads the marked positions, save the position data in the computer, correct the exposure data, then do the exposure. In this embodiment, because the light from the stage surface reflection is not very strong, the vision system is hard to read it in some cases. If so, a thin sheet can be put on the stage surface to assist the reading of the reflected pattern positions.

Another aspect of the present system includes: a substrate with photo sensitive material on both sides for exposing; two maskless optical engines separately set at each side of the substrate; one light source for each maskless optical engine, or two maskless optical engines share one light source by a beam splitter; the light source has two wavelength segments, one of which is for exposing, e.g., UV light, and the other is for calibration and not sensitive to the photo sensitive material on the substrate, e.g., yellow or red light; a vision system without a separate light source is mounted with one of the maskless optical engines, and its optical axis is aligned with the maskless optical system axis through a beam splitter; the beam splitter is mostly transparent for the exposure light and about 50% reflective for the vision system light; the focus plane of the vision system is the same as the maskless optical engine; a XY motion stage that is controlled by a control system and synchronized with the maskless optical engines; the stage can make relative moving between maskless optical engines and the substrate; the stage uses transparent material on the exposure area which allows exposure light to reach the substrate; one of the stage surfaces is coated for partial reflection of the calibration light; each maskless optical engine has an individually controlled Z stage to change the distance between the maskless optical engine and substrate. In the auto-calibration process, the substrate is not put on the stage, and the two maskless optical engines are already pre-aligned at the time of design and fabrication, or by the control system. First, the system sends the alignment pattern to each engine and turn on the calibration light source with proper light intensity. Second, it adjusts each optical engine's Z position to focus each alignment pattern on the stage surface, which is transparent and also reflect part of the calibration light, usually 50%, depending on camera sensitivity and the calibration light source. One of pattern is reflected back to the vision system, and the light from another maskless optical engine passes through the stage surface into the vision system as well because the light is just reflected partially; then vision system can have both alignment patterns in the camera and read each alignment position to get the distance between the two optical engines. This position data will be saved in the computer system for data correction in exposure process. In the exposure process, the exposure light sources are initially off, and the vision system send a total white pattern (all pixel-on) in maskless optical engines; the second step is to put the substrate on the stage. If the substrate has no pattern on the surfaces, the system can directly do exposure with the corrected data saved in the computer. If there is an existing pattern on the substrate surface, the vision system can read the marked positions, save the position data in the computer, correct exposure data, then do the exposure. In this embodiment, because the light from the stage surface reflection is much stronger, it is easier for the vision system to read. If the stage surface has no coating, a thin sheet can be put on the stage surface for reading the reflected pattern position.

Another aspect of the present system includes: a substrate with photo sensitive material on both sides for exposure; two DMD maskless optical engines separately set at each side of the substrate; one light source for each maskless optical engine, or two maskless optical engines share one light source by a beam splitter; the light source has two wavelength segments, one is for exposure, such as UV light, and the other is for calibration and not sensitive for the photo sensitive material on the substrate, such as yellow or red light; a vision system without a dedicated light source is mounted with one of the DMD maskless optical engines and aligned its optical axis with the DMD maskless optical system axis through a beam splitter; the beam splitter is transparent for exposure light and about half reflective for calibration light; the focus plane of the vision system is the same as the DMD maskless optical engine; a XY motion stage controlled by control system and synchronized with the maskless optical engines, the stage can make relative movement between DMD maskless optical engines and the substrate, and the stage uses transparent material on the exposure area which allows exposure light to reach the substrate; each DMD maskless optical engine has an individually controlled Z stage to change the distance between the DMD maskless optical engine and substrate. In the auto-calibration process, the substrate is not put on the stage, and the two DMD maskless optical engines are already pre-aligned at the time of design and fabrication or by the control system. First, the system sends the alignment pattern to each engine and turn on the calibration light source with proper light intensity. Second, one adjusts the Z position of the optical engine located on the other side of the vision system, so the light passes through the stage surface into the vision system. The vision system will then has the DMD position in the camera. It reads the alignment position, then power off the DMD maskless optical engine (pixel panel power-off). The light from another DMD optical engine will go through stage surface and the first optical engine lenses to reach the DMD panel surface that is power-off. The light is reflected back by the panel because the mirrors in this DMD are in a flat status. The reflected light will go through stage surface again, and part of the light will be reflected to the vision system by the beam splitter so that the vision system can read the power-on DMD position. The computer system will correct the data according to the two DMD positions.

In the exposure process, the exposure light sources are initially off, and the calibration light sources are on. For a substrate with no existing pattern, the system can directly do exposure with the correct data saved in the computer. If there is a pattern on the substrate surface, the vision system can read the mark positions, save the position data in the computer, correct exposure data, then do the exposure. In this embodiment, because the light from the DMD surface reflection is much stronger, it is much easier for the vision system read. The calibration process can be done any time when there is no substrate.

In some embodiments, the system can includes many maskless optical engines for bigger exposure area and higher productivity.

In some embodiments, the light source can use beam splitter to combine two different wavelength segments of light.

In some embodiments, the light source can use optical fiber to combine two different wavelength segments of light.

In some embodiments, the system also use one vision systems for each side of the stage.

In some embodiments, the system can include one vision system for each side, and each vision system has a dedicated light source.

In some embodiments, the stage may only allows movement in the X direction, but separate movements in the Y and Z directions for the maskless optical engines.

In some embodiments, the stage also allows X-Y stepping for exposing.

In some embodiments, the system also allows separate movements in the Y and Z directions for each maskless optical engine.

Therefore, one advantage of the present system is that it provides a double-sided maskless exposure system and method with increased productivity.

Another advantage of the present system is that it eliminates or reduces the double side alignment problems in the art associated with conventional masks.

Still another advantage of the present system is that it provides an improved double-sided exposure system, such improvements being the simple process, high yield, scaling compensation, distortion compensation requirement.

A further understanding of the nature and advantages of the present system may be assisted by the remaining portions of the specification and the drawings.

BRIEF DESCRIPTION OF THE DRAWINGS

The above and other objectives, features and other advantages of the present system will be more clearly understood from the following detailed description when taken in conjunction with the accompanying drawings, in which.

DETAILED DESCRIPTION

Figure 1:
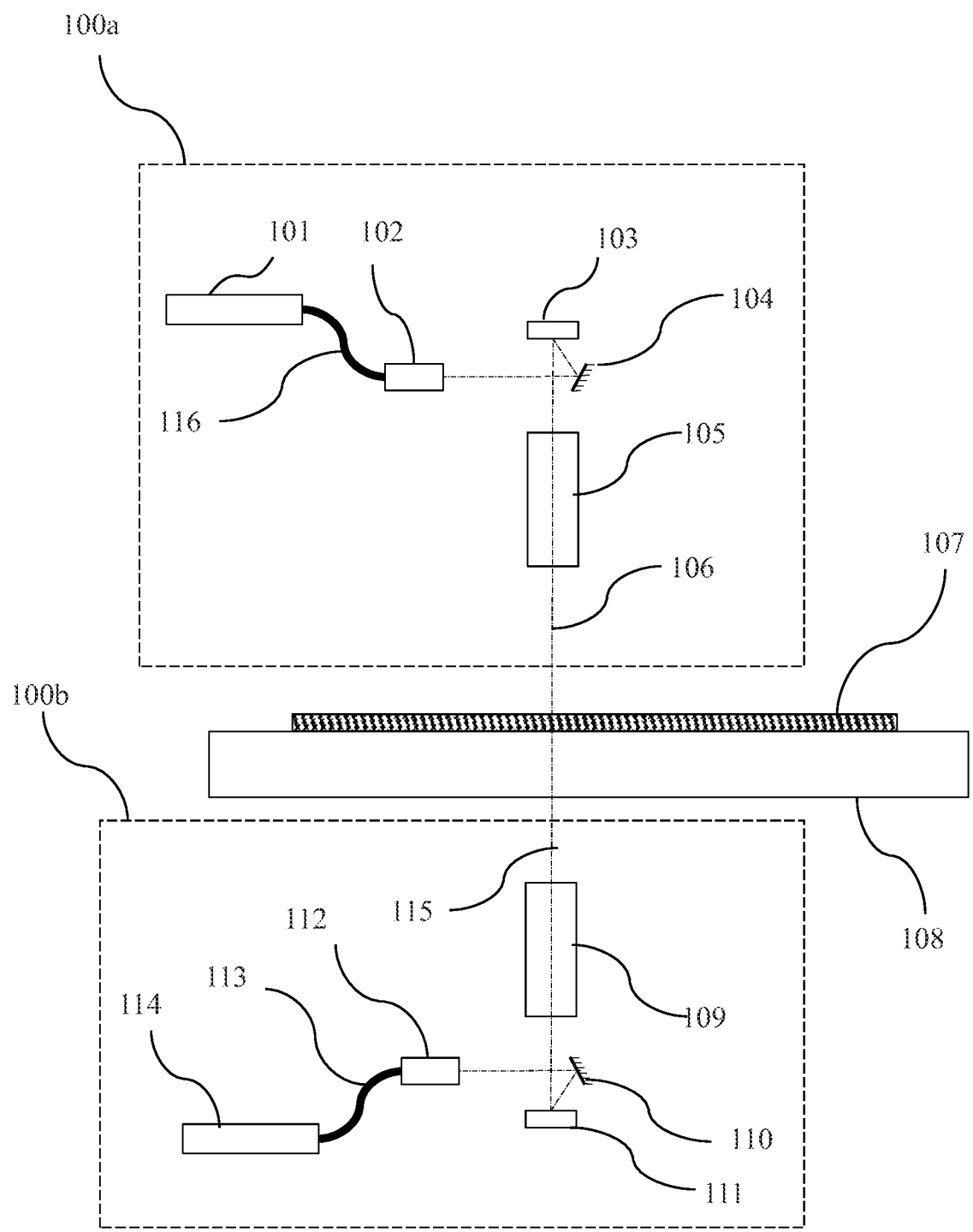
FIG. 1 is a basic diagram illustrating a double-sided maskless exposure system.

The present disclosure relates to double-sided maskless exposure systems, which can be used in PCB, LCD, lead frame, and semiconductor photolithographic processing. It includes a number of embodiments for implementing various features of the system and method. Specific examples of components and arrangements are described below to demonstrate the various configurations. It is understood that none of these examples is intended to limit the scope of the claims.

Reference will now be made in greater detail to an exemplary embodiment of the present system, examples of which are illustrated in the accompanying drawings. Wherever possible, similar reference numerals are used throughout the drawings and the description to refer to the similar parts to ease understanding.

With reference now to FIG. 1, a double-sided maskless exposure system includes two sets of maskless optical engines 100a and 100b. Each optical engine includes a light source (101, 114) having an optical fiber (116, 113) and light collimator and homogenizer (102, 112). The light outputted from the light collimator and homogenizer (102, 112) is reflected by mirror (104, 110) to a spatial light modulator (103, 111), and an optical lens (105, 109). Images the spatial light modulator (103, 111) are directed to a subject 107. A photoresist layer may be disposed on the both sides of the subject 107.

The light collimator and homogenizer (102, 112) provides a uniform light beam onto the spatial light modulator (103, 111). A stage surface plate 108 holds the substrate 107 and is transparent directly under the substrate area. The stage surface plate 108 can be translated in an XY direction by a control system. The spatial light modulator (103, 111) creates a desired pixel pattern referred to as the pixel-mask pattern. The pixel-mask pattern may be resident at the spatial light modulator (103, 111) in synchronization with the stage surface plate movement.

Light emanating from the pixel-mask pattern of the spatial light modulator (103, 111) then passes through the optical system (105, 109). The light from the optical system 105 focuses onto the one side of the substrate 107 and the light from optical system 109 passes through the stage surface 108 and focuses on the other surface of the substrate. In this manner, the pixel-mask pattern is projected onto both sides of the substrate 107.

The spatial light modulator (103, 111) and optical system (105, 109) may be aligned with each optical axis (106, 115). The substrate 107 may be a PCB board such as is used in conventional fabrication of printing circuit board, a glass substrate, plastic substrate or a semiconductor wafer. It is understood, however, that many different substrates can benefit from this apparatus and method, including for example, a non-flat substrate.

Z axis translators for focus adjustment of maskless optical engines 100a, 100b may be utilized. One potential issue is the optical axis (106, 115) alignment due to environment conditions such as vibration or temperature variations. Another potential issue is vision system alignment of PCB patterns if a pattern exists on the substrate 107.

Figure 2:
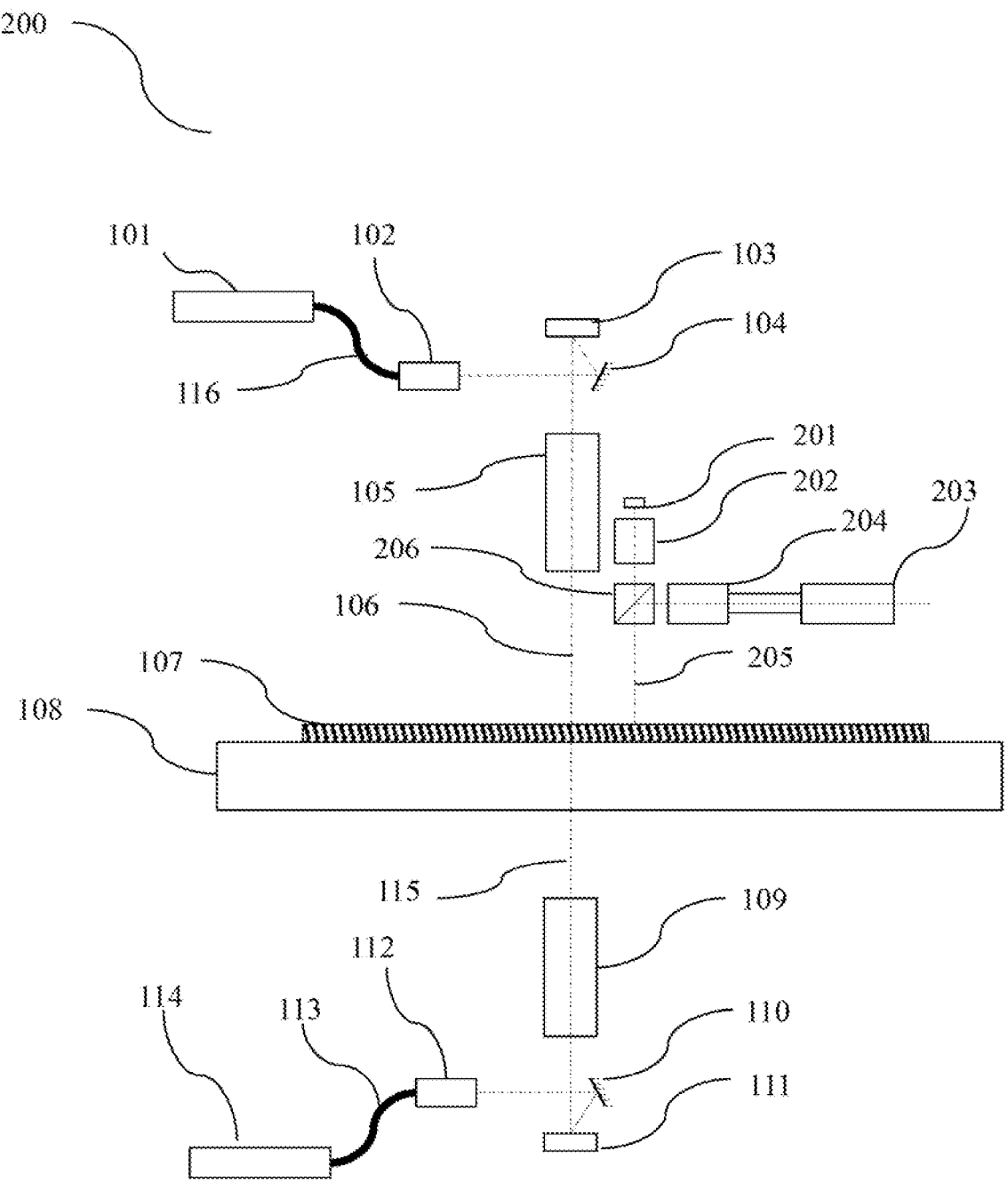
FIG. 2 illustrates a double-sided maskless exposure system with a vision system.

FIG. 2 shows a double side maskless exposure system with a traditional vision system. The vision system consists of a camera 203, an image lens 204 and a light source 201. A collimation lens 202 is used to collect the light from the light source 201 and illuminate the substrate 107 thru a beam splitter 206. The beam splitter generally reflects approximately half of the light and transmits the other half. The light reflected back from the substrate 107 is directed into the camera lens 204 and camera 203. The camera can then read the pattern on the substrate. In this example, the vision system is used for alignment between patterns as the vision system optical axis is not aligned with maskless optical system axis (106, 115). If the maskless optical system axis (106, 115) is misaligned, the vision system cannot perform an inline check.

Figure 3:
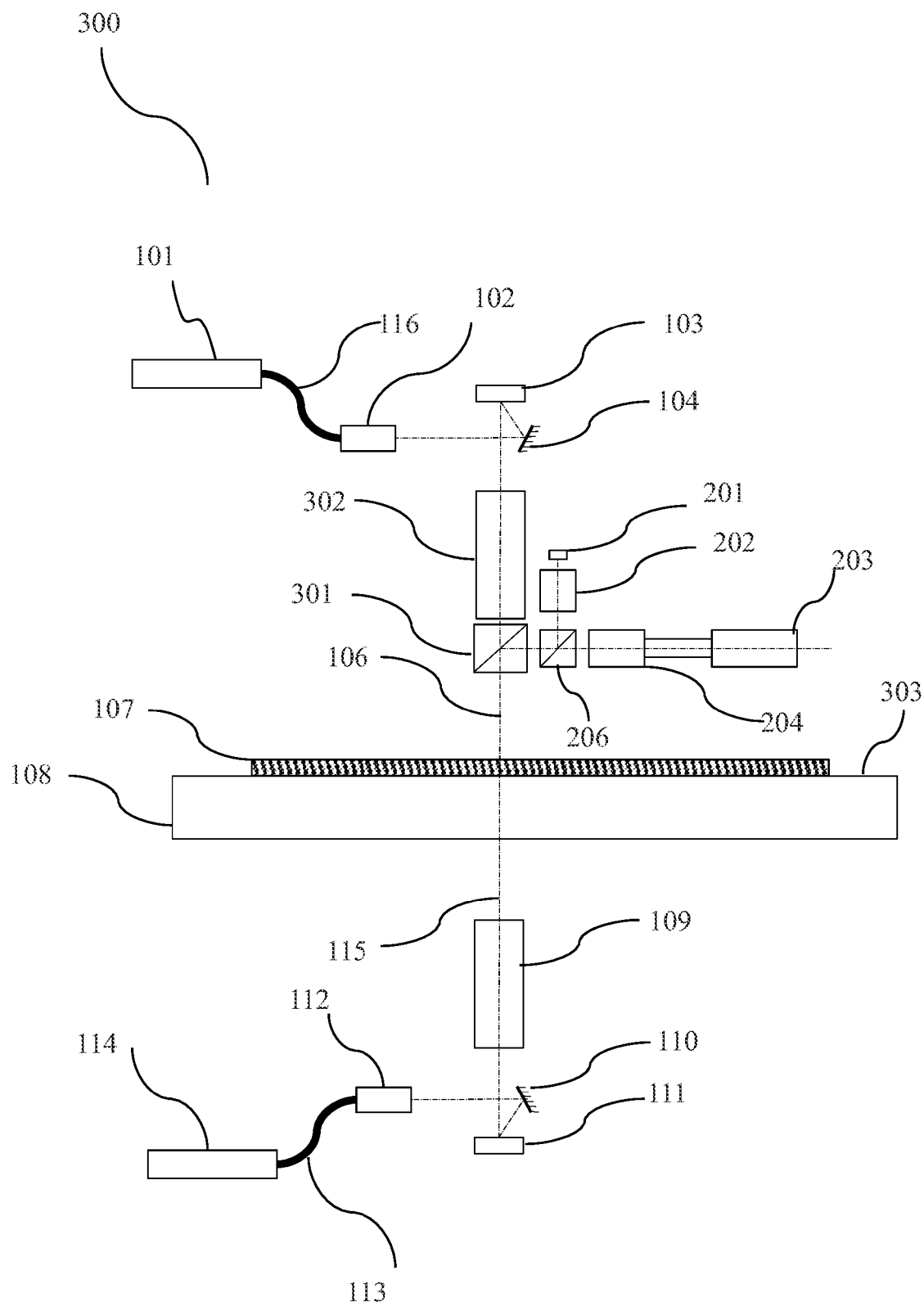
FIG. 3 illustrates a double-sided maskless exposure system with a co-axial vision system.

FIG. 3 shows an approach to ascertain the maskless optical system alignment information from the vision system. In this example there is an additional beam splitter 301 added to the system 200. The purpose of this additional beam splitter is to combine the vision system axis and maskless optical system axis 106. The beam splitter 301 allows light to be directed from the light source 101 and receive reflected light from light source 201.

The optical system 302 requires calibration for high image quality. In the auto-calibration process the two maskless optical axis (106, 115) are pre-aligned. The alignment pattern is sent to each spatial light modulator (103, 111) and the exposure light source 101(114) is gated on. Each optical engine Z position is adjusted to focus an alignment pattern on the stage surface 303. The light from the optical system 302 is directed through the beam splitter 301 and is reflected from the surface 303. This reflected light is directed to the camera 203 by beam splitter 301. The camera reads the pattern to ascertain the optical axis position 106. The light from the other maskless optical engine passes through the stage surface plate 108 to the vision system.

The vision system can view the alignment patterns in the camera 203 and read each axis position. This position data can be saved for data correction in the exposure process. During exposure, the exposure light sources (101,114) are gated off and the vision system light source 201 are gated on. The substrate 107 is placed on the stage and if the substrate does not have a pattern, the system can directly expose utilizing the corrected data. If a pattern exists on the substrate surface 107, the vision system can read the marked positions for future exposure correction.

Figure 4:
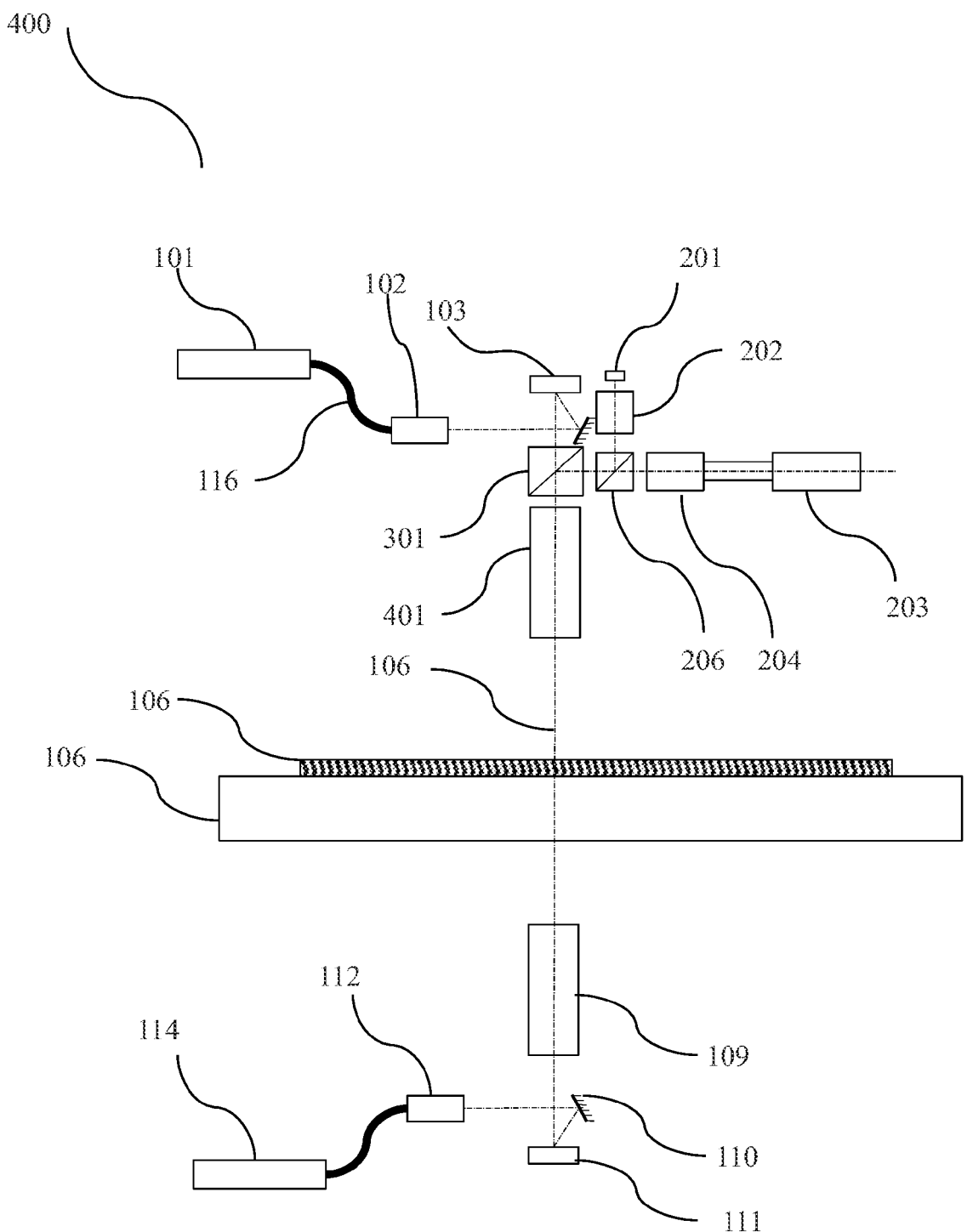
FIG. 4 illustrate another embodiment of FIG. 3.

FIG. 4 shows another approach which is related to FIG. 3. In this example the vision system and beam splitter 301 are placed proximate to the spatial light modulator. The camera lens 204 may be removed if the focal length of the optical system 401 is large enough.

Figure 5:
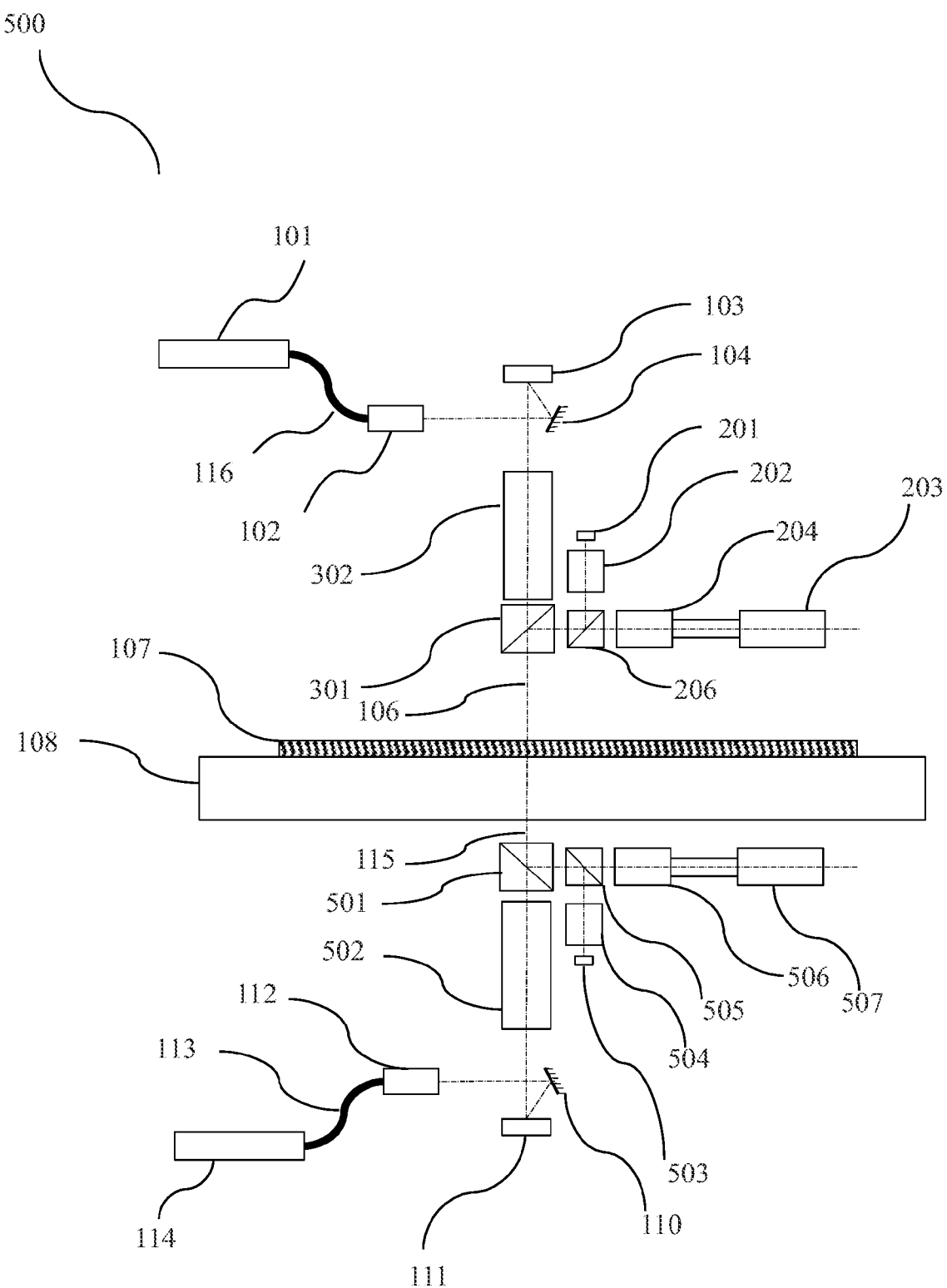
FIG. 5 illustrate a double-sided maskless exposure system with two co-axial vision system.

FIG. 5 shows a double vision system for checking alignment. The beam splitters (301,501) receive light from the light sources (101,114) and from the vision system light sources (201,503). In the auto-calibration process, the substrate 107 is a highly transparent glass with indicia in the vision system view area onto the stage surface plate 108. The two maskless optical systems (302,502) are pre-aligned.

The alignment pattern is sent to each spatial light modulator (103, 111) and the exposure light source (101, 114) is set to the proper light intensity. Each optical engine Z position is adjusted to focus the alignment pattern on the substrate mark. The light from the optical system 302 is directed through the beam splitter 301 and is reflected by beam splitter 501 to camera 507. The camera 501 reads the pattern, and the substrate mark is read by camera 507. Camera 507 ascertains the optical axis 106 position relative to the mark. The light from the other maskless optical system 502 passes through beam splitter 501 and the stage surface plate 108. The camera 203 can read the substrate mark. The vision system ascertains the optical system axis 115 position relative to the same mark. Therefore the system ascertains both of the optical system axis positions (106, 115).

Figure 6A:
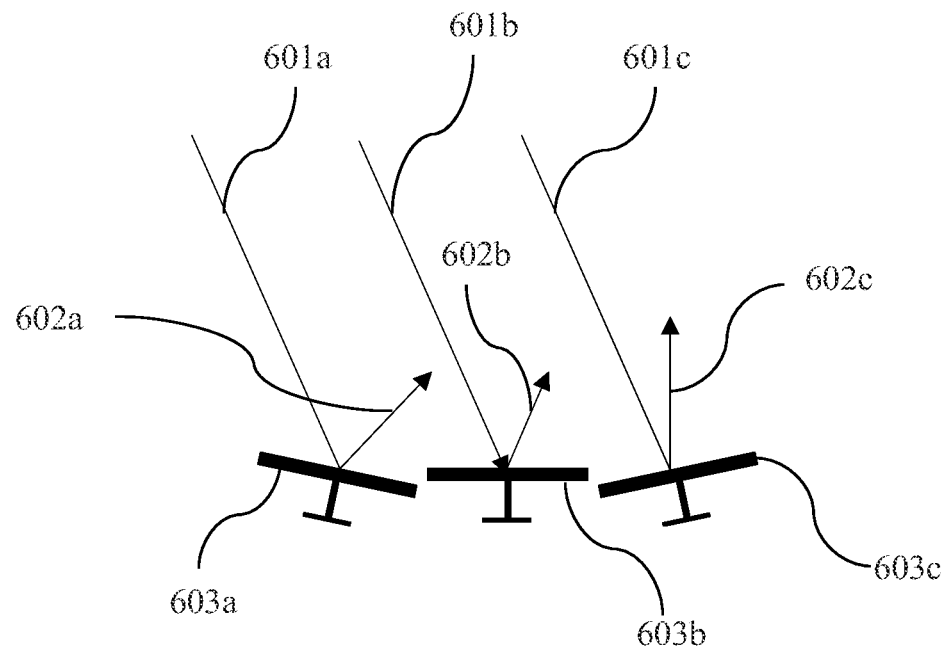
FIG. 6 illustrates DMD mirror status and light ray directions.
Figure 6B:
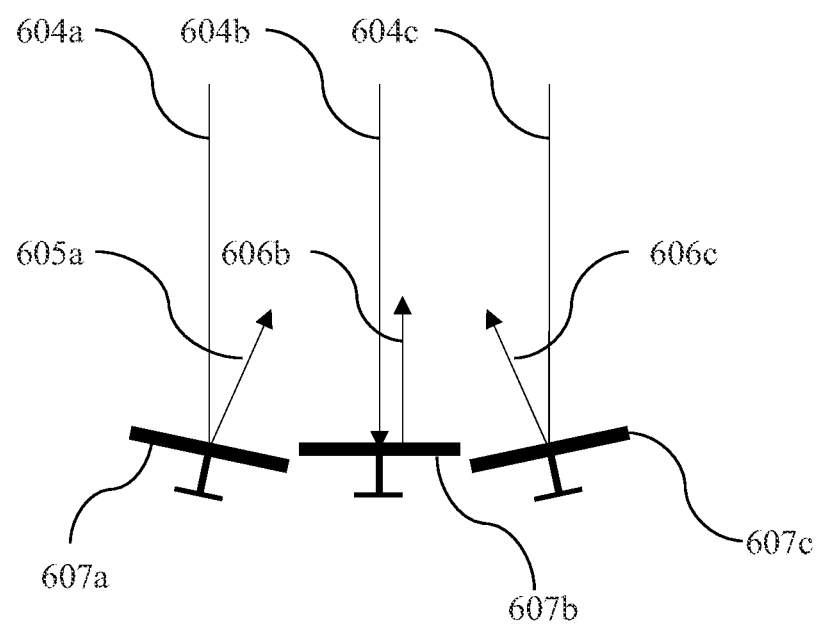

FIGS. 6a and 6b show a Digital Mirror Device (DMD) and light ray direction. In FIG. 6a, paths 601a, 601b and 601c are parallel to the incident light rays. Mirror 603a and 603c indicate on/off status of the DMD when powered-on. The mirror 603b shows the status of the DMD when powered off. The mirror 603a indicates an off status because the light ray 601a is reflected off of the mirror. The mirror 603c reflects a light ray 601a to the DMD normal direction 602c. In FIG. 6b, a set of parallel incident light rays 604a, 604b, 604c are directed in a normal direction. The mirrors 607a, 607c reflect light rays from the normal direction as the light rays 605a, 605b. The mirror 607b reflects the light ray 604b. A normal incident light will be reflected back from DMD mirror if the DMD is powered-off. This normal reflection property is also very useful for maskless optical engine alignment in FIGS. 3-5.

In FIG. 3, if the spatial light modulators 102 and 111 are DMDs. In the system the auto-calibration process begins with the two maskless optical axis 106 and 115 are pre-aligned. An alignment pattern is resident on the spatial light modulator 111 and the exposure light source 114 is set to the proper light intensity. The optical engine Z position is adjusted to focus the alignment pattern from spatial light modulator 111 to the vision system camera 203, so the camera can read the spatial light modulator 111 position. The spatial light modulator 111 and the light source 114 are gated off and the light source 101 and spatial light modulator 103 with the alignment pattern are gated on. The light from the optical system 302 is directed through the beam splitter 301, optical system 109 to image the alignment pattern on the spatial light modulator 111. The light is reflected back from the spatial light modulator 111 and is directed through optical system 109 to be reflected by beam splitter 301 to the camera 203. At this point the camera can read the pattern and the optical axis 106 position.

The vision system view both alignment patterns in the camera 203 and read each axis position. A similar process can be also applied to FIGS. 4 and 5. In the case of Liquid Crystal On Silicon (LCOS), if the pixels are gated off and the spatial light modulator is gated-on, the light from the optical system 109 will be reflected back to the optical system 109. In this instance this maskless optical engine is equivalent to a reflecting mirror on the stage surface plate 108.

Figure 7:
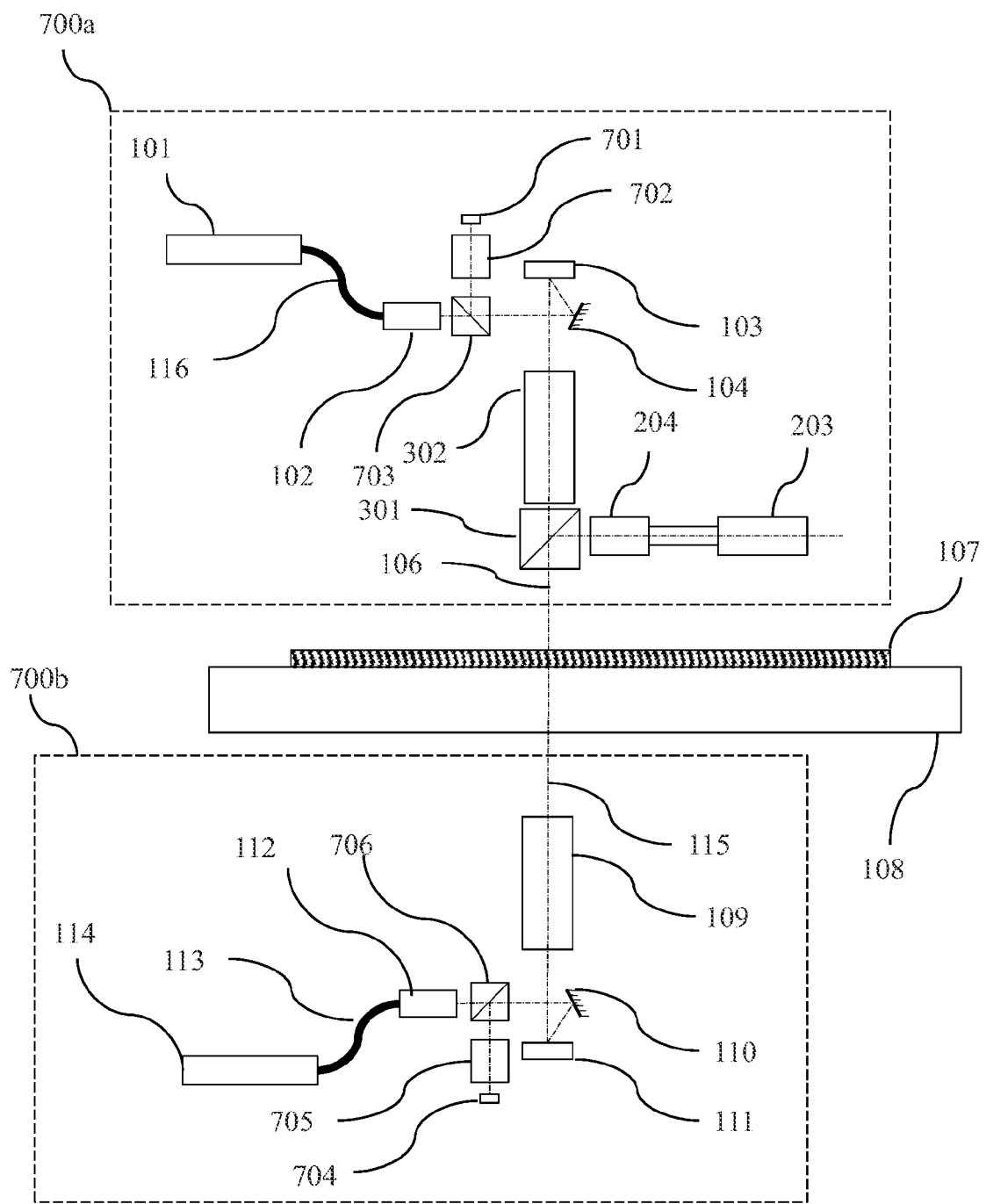
FIG. 7 illustrates a double-sided maskless exposure system with a co-axial vision system and two calibration light sources.

With reference to FIG. 7, the double side maskless exposure system includes two sets of maskless optical engines 700a and 700b. Each optical engine includes light sources 101 and 114 with optical fibers 116 and 113, and a light collimator and homogenizer 102 and 112 which provides a uniform light beam onto the spatial light modulator (103, 111). The system includes another light source (701, 704) which has a different light wavelength which does not affect the photo sensitive material on the substrate.

The beam combiner (703, 706) has an optical coating to combine two light beams together. The output light from (102, 112) is reflected by a mirror (104, 110) to a spatial light modulator (103, 111), such as DMD. An optical lens (105, 109) images the spatial light modulator (103, 111) to the subject 107. A photo resist layer or coating may be disposed on the both sides of the subject 107.

A stage surface plate 108 holds the substrate 107 and is transparent under the substrate area. The stage surface plate 108 can be translated in the XY direction by a control system. The spatial light modulator (103, 111) creates a desired pixel pattern (the pixel-mask pattern). The pixel-mask pattern may be resident at the spatial light modulator (103, 111) and synchronized with the stage surface plate movement. Light emanating from (or through) the pixel-mask pattern of the spatial light modulator (103, 111) then passes through the optical system (105, 109), which is optimized for both of the light sources (101,114) and (701, 704).

Light from optical system 105 focuses the image of the spatial light modulator 103 onto one side of the substrate 107 and the light from optical system 109 passes through the stage surface 108 and focuses the image of spatial light modulator 704 on the other surface of the substrate. In this manner, the pixel-mask pattern is projected onto the both sides of the substrate 107.

The spatial light modulator (103, 111) and the optical system (105, 109), can be aligned for each optical axis (106, 115). In the engine 700a, there is a beam splitter 301 and a vision system (204, 203). The beam splitter passes light (101, 114) and partially reflects light (701, 704). The substrate 107 may be a PCB board such as is used in conventional fabrication of printing circuit board or a wafer.

It may is desired to project a plurality of patterns on the substrate 107 using the maskless exposure system. In this example, there may be Z axis translators for focus adjustment of maskless optical engines 700a, 700b. During the auto-calibration process the two maskless optical axis 106,115 are pre-aligned. An alignment pattern is placed on the spatial light modulator 111 and the light source 704 is illuminated. The optical engine 700b adjusts the Z position to focus the image of the alignment pattern from spatial light modulator 111 onto the vision system camera 203 through beam splitter 301 and camera lens 204. In this way the camera 203 can read the spatial light modulator 111 position. The spatial light modulator 111 and the light source 704 are gated off and the light source 701 and spatial light modulator 103 with the alignment pattern are gated on.

The light from the spatial light modulator 103 passes through the optical system 301, the beam splitter 301, the stage surface plate 108, the optical system 109 and images the alignment pattern onto the spatial light modulator 111. The light will be reflected from the spatial light modulator 111 and passes through the optical system 109, the stage surface plate 108 and be reflected by beam splitter 301 to the camera 203. Since spatial light modulator 103, spatial light modulator 111 and camera 203 are conjugated by optical systems 302, 109 and camera lens 204, the image position of spatial light modulator 103 is insensitive to the optical system axis 115, 106 mis-alignment of the camera 203. In this example, the maskless optical engine 109 is equivalent to a reflecting mirror on the stage surface plate 108 for the light from the optical system 302.

The vision system can view the alignment patterns in the camera 203 and read each axis position. In the exposure process, the exposure light sources 101,114 are gated off and the light source 701 is gated on. The system can be used to expose the substrate with the corrected data if the substrate is un-patterned. If the substrate is patterned and has alignment marks on the substrate surface 107, the vision system reads the mark positions then saves the position and exposure data. If there is an pattern on the spatial light modulator 103, the camera can read this pattern and alignment mark at same time to get more accurate distance between spatial light modulator 103 and substrate marks. If the maskless optical engines do not mount on separated y moving stages, the calibration process can be done for each scanning start point or stepping position to get optimized correct exposure and alignment data.

Figure 8:
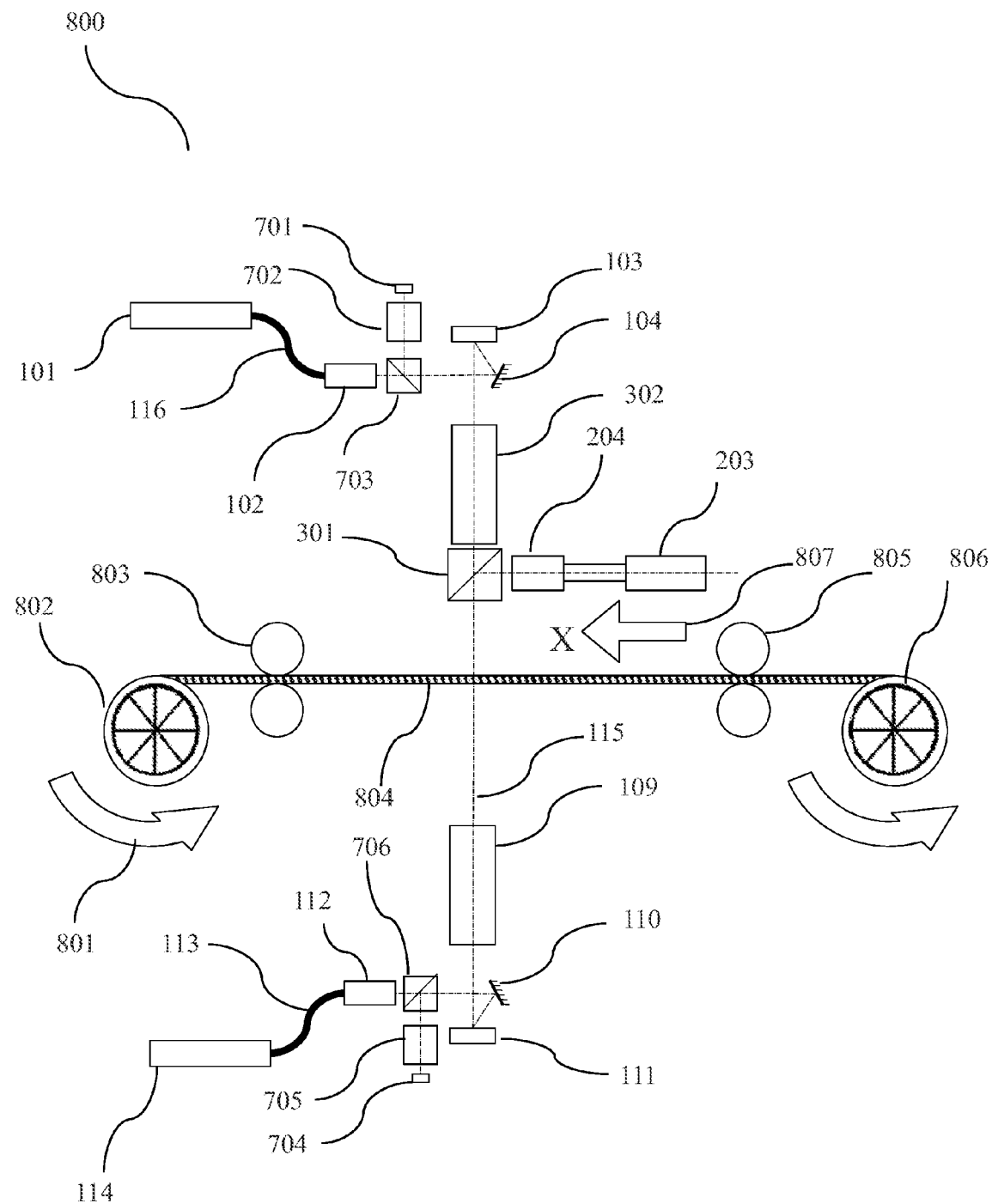
FIG. 8 illustrate a continuous double-sided maskless exposure system of the present system.

Referring now to FIG. 8, is a modification of the embodiment of the FIG. 7. The double side maskless exposure system 800 in FIG. 8 utilizes the same maskless optical engines as 700a and 700b but the substrate in this example is a flexible roll. A pair of rollers 803 and 805 controls the substrate 804 speed. Rollers 802 and 806 are for continuously receiving and supplying substrate 804. The substrate can continuously move in the x direction 807. The maskless optical engines may have Z stage for adjusting focus and Y stage for handling wide substrates.

Figure 9:
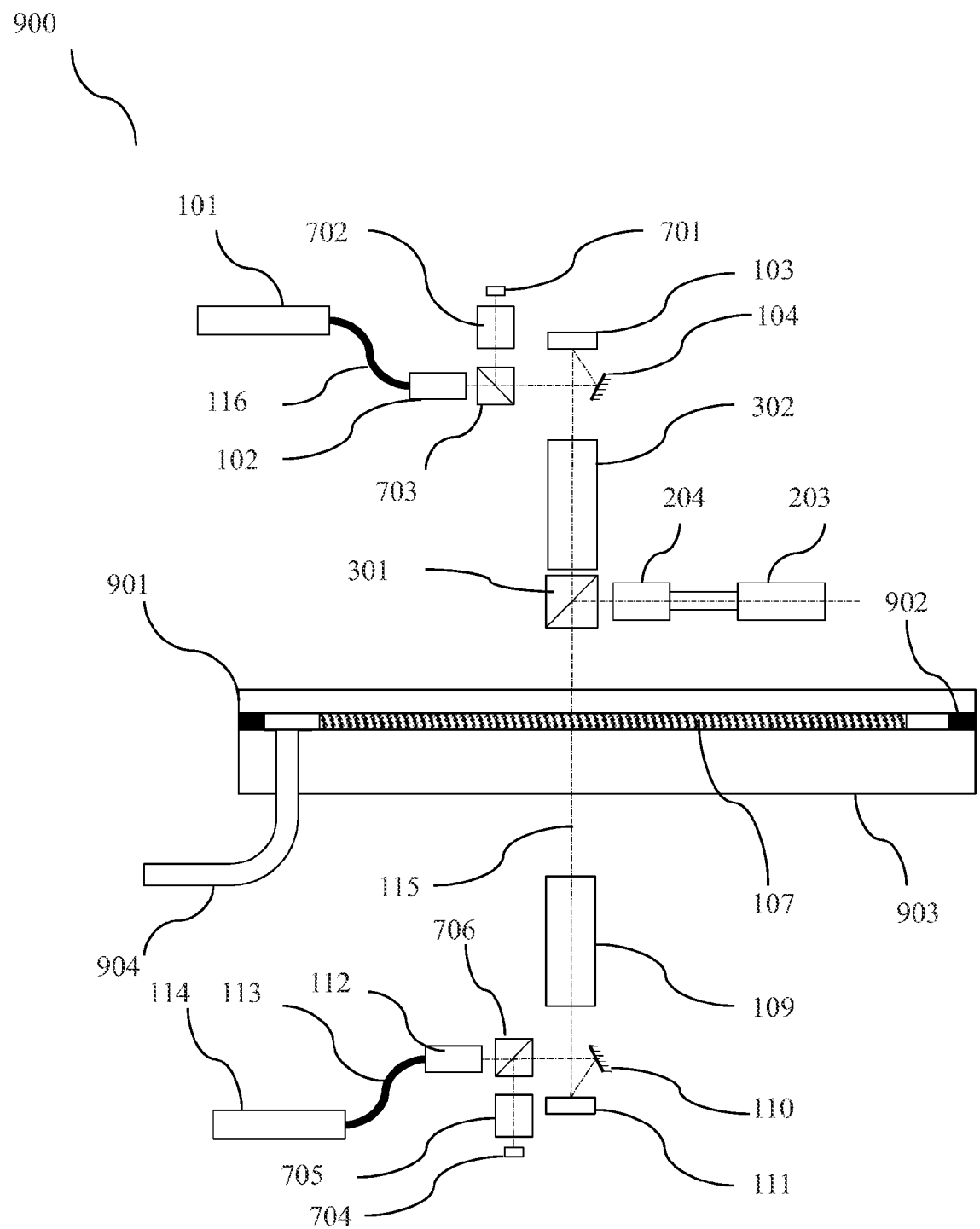
FIG. 9 illustrates another embodiment of the present system with a vacuum chuck to hold a substrate.

FIG. 9 illustrates a double side maskless exposure system 900 using a vacuum chuck for holding the substrate 107. This system may be used with substrates that are not flat enough for the depth of focus (DOF) of the optical system (302, 109). The vacuum chuck consists of top plate 901, a base plate 903, a vacuum hose 904 and a soft seal material 902. The top plate and base plate are transparent in the substrate area. The surfaces may be coated with anti-reflective material.

Figure 10A:
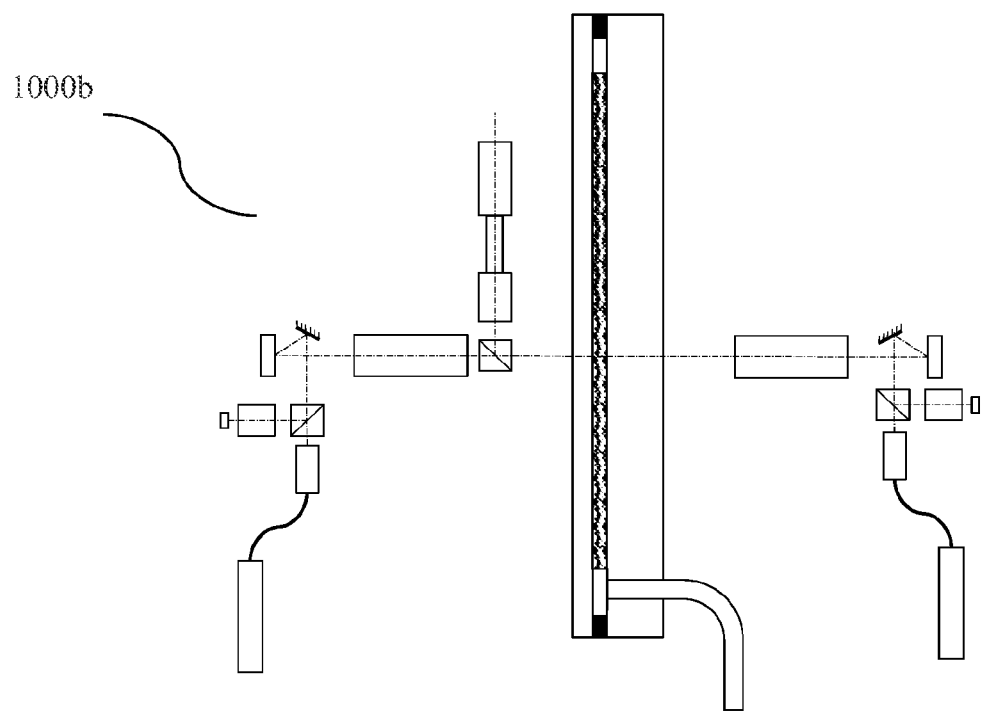
FIG. 10 illustrates another vertical and tilt embodiments of FIG. 9.
Figure 10B:
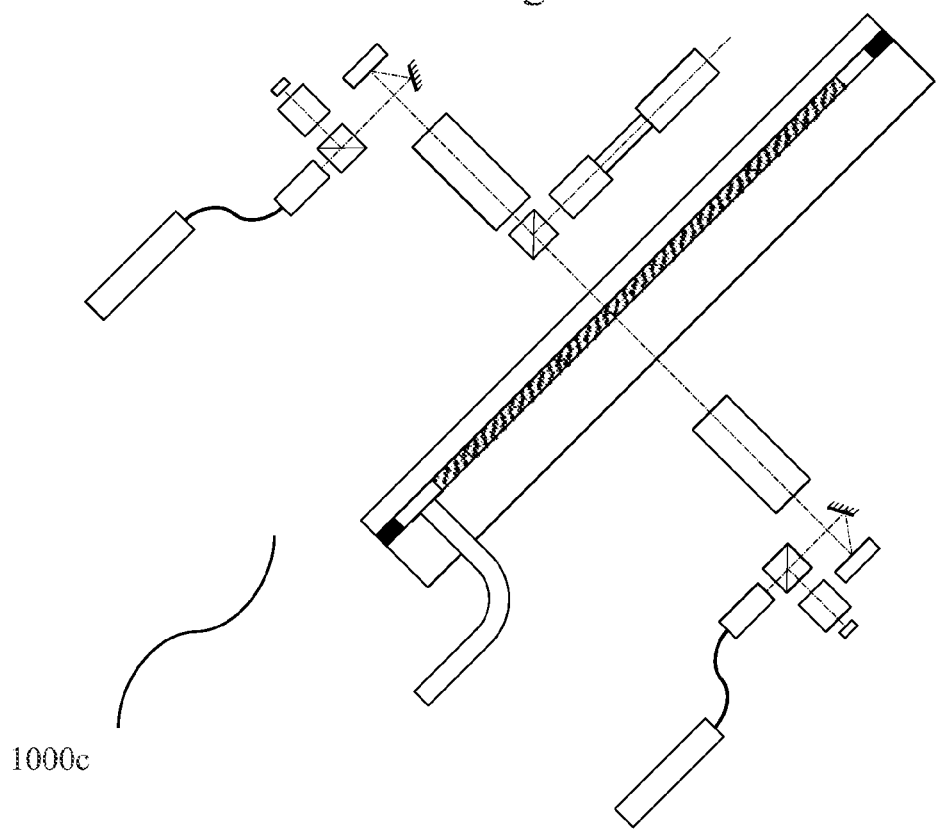

FIGS. 10a and 10b illustrate two embodiments of FIG. 9. The double side maskless exposure system may be set at vertical or in a tilted direction.

Figure 11A:
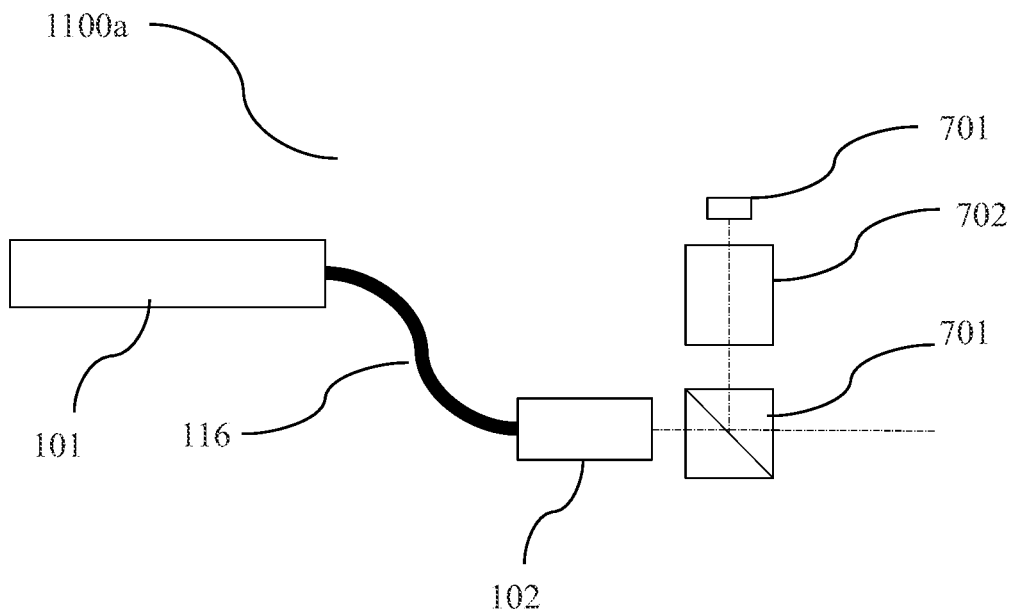
FIG. 11 illustrates two types of two segment wavelength light source in the present system.
Figure 11B:
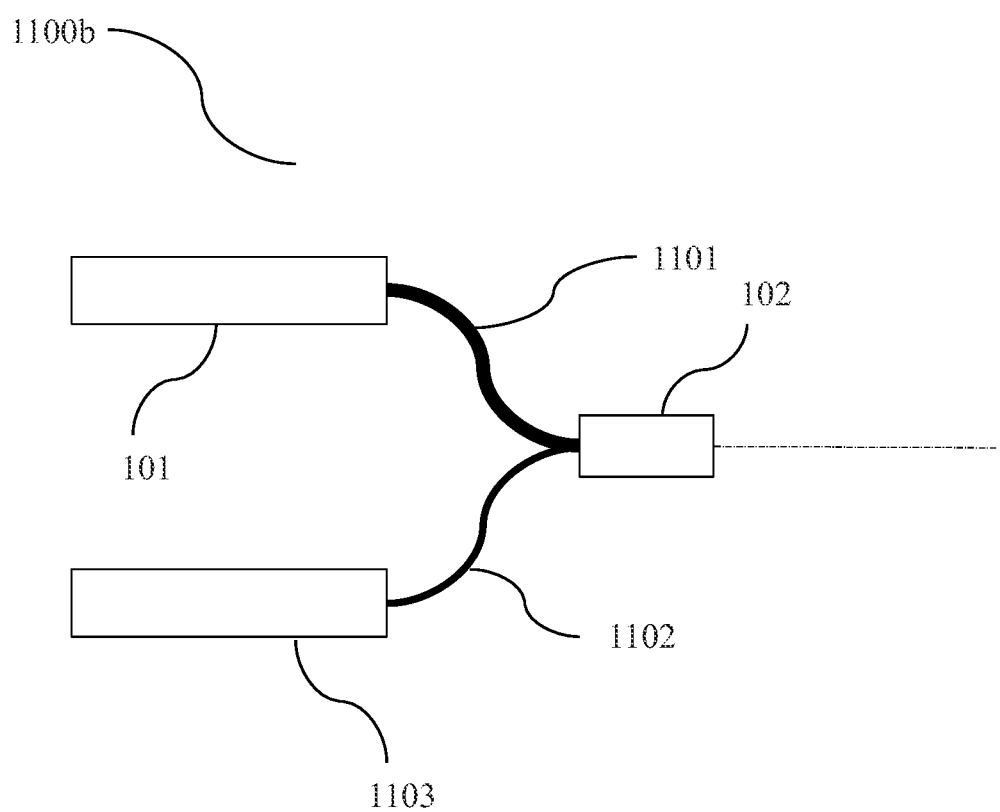

FIGS. 11a and 11b illustrate two types of light source combiners. One is a dielectric coating and another is an optical coupling. In FIG. 11a, the light source 701 is collimated by lens 702 and then reflected by beam combiner 701. In FIG. 11b, the light source 1103 and the exposure light source are separately coupling into optical fibers 1102 and 1101. The optical fibers are then bundled together as one optical fiber beam in the front of the collimator and homogenizer 102. The system shown by FIG. 11b may be used for laser light sources. The system of FIG. 11a may be suitable for LED light sources.

Figure 12:
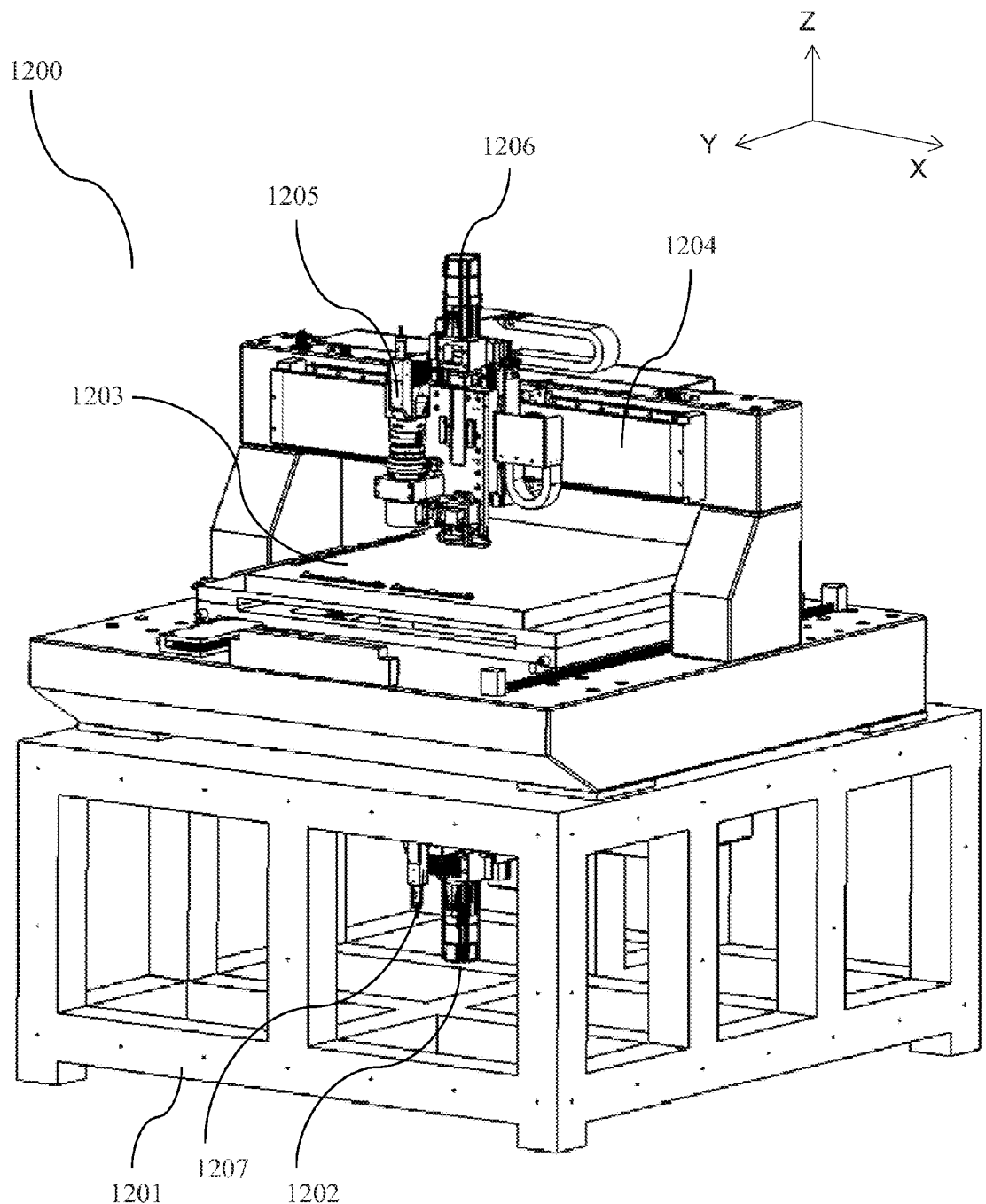
FIG. 12 illustrates a perspective view of a system design of the present system.

FIG. 12 illustrates a perspective view of a system design of the apparatus. The system consists of two sets of maskless optical engines 1207, 1205, an optical engine moving stage 1206, 1202 and 1204, a scanning stage 1203 and a base frame 1201.

Figure 13:
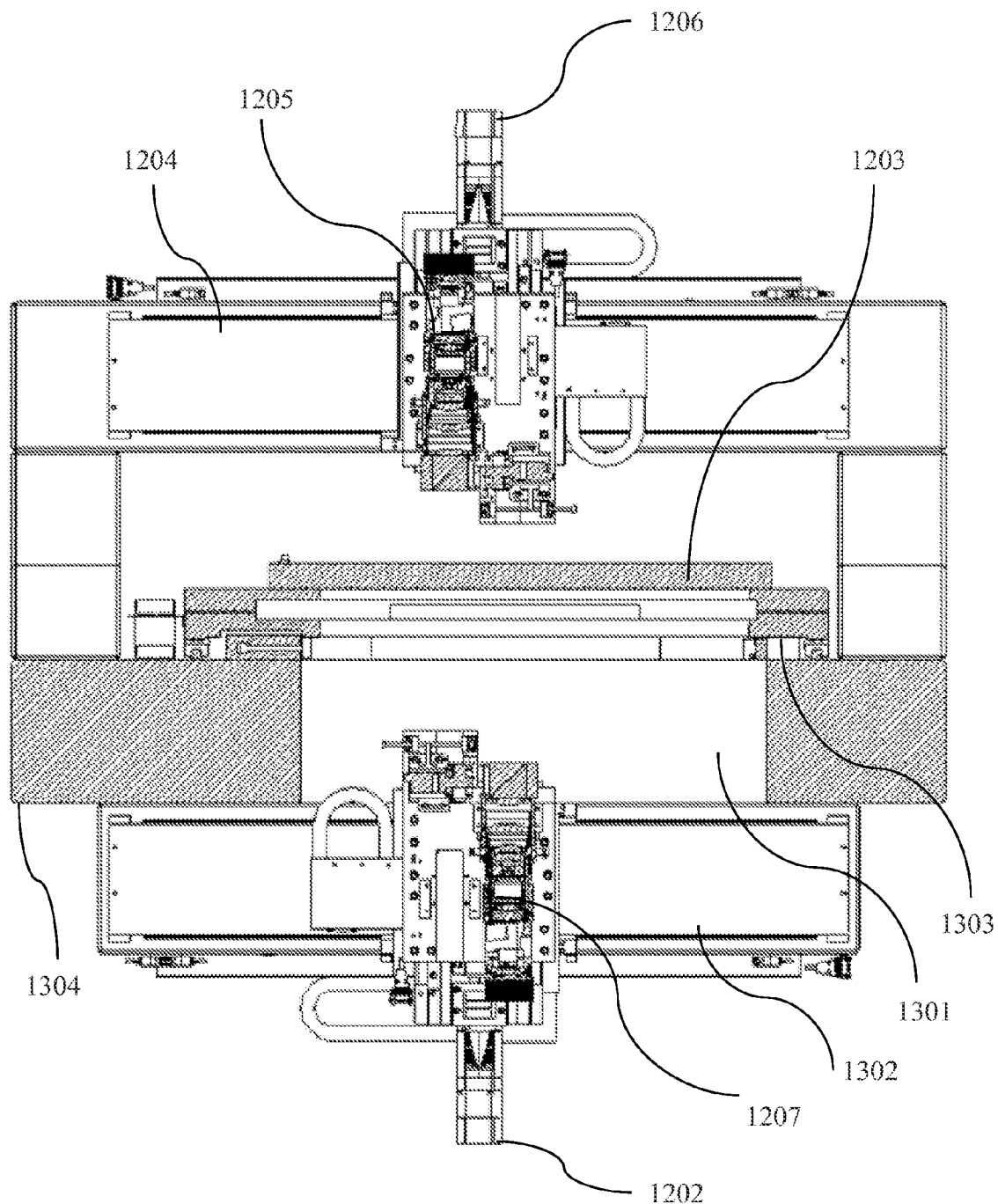
FIG. 13 illustrates a front view of FIG. 12.

FIG. 13 is a front view of FIG. 12. The maskless optical engines 1205, 1207 have individual XZ stages 1204, 1206, 1302 and 1202. The Y stage 1304 supports the substrate and synchronizes scanning with the maskless optical engines 1206 and 1202. The Y stage table 1203 is mounted on a very heavy stone base 1304. The stone base 1304 has a hole 1301 and an empty area under the stage surface plate 1203. The stage surface plate 1203 is transparent for the exposure light.

Figure 14:
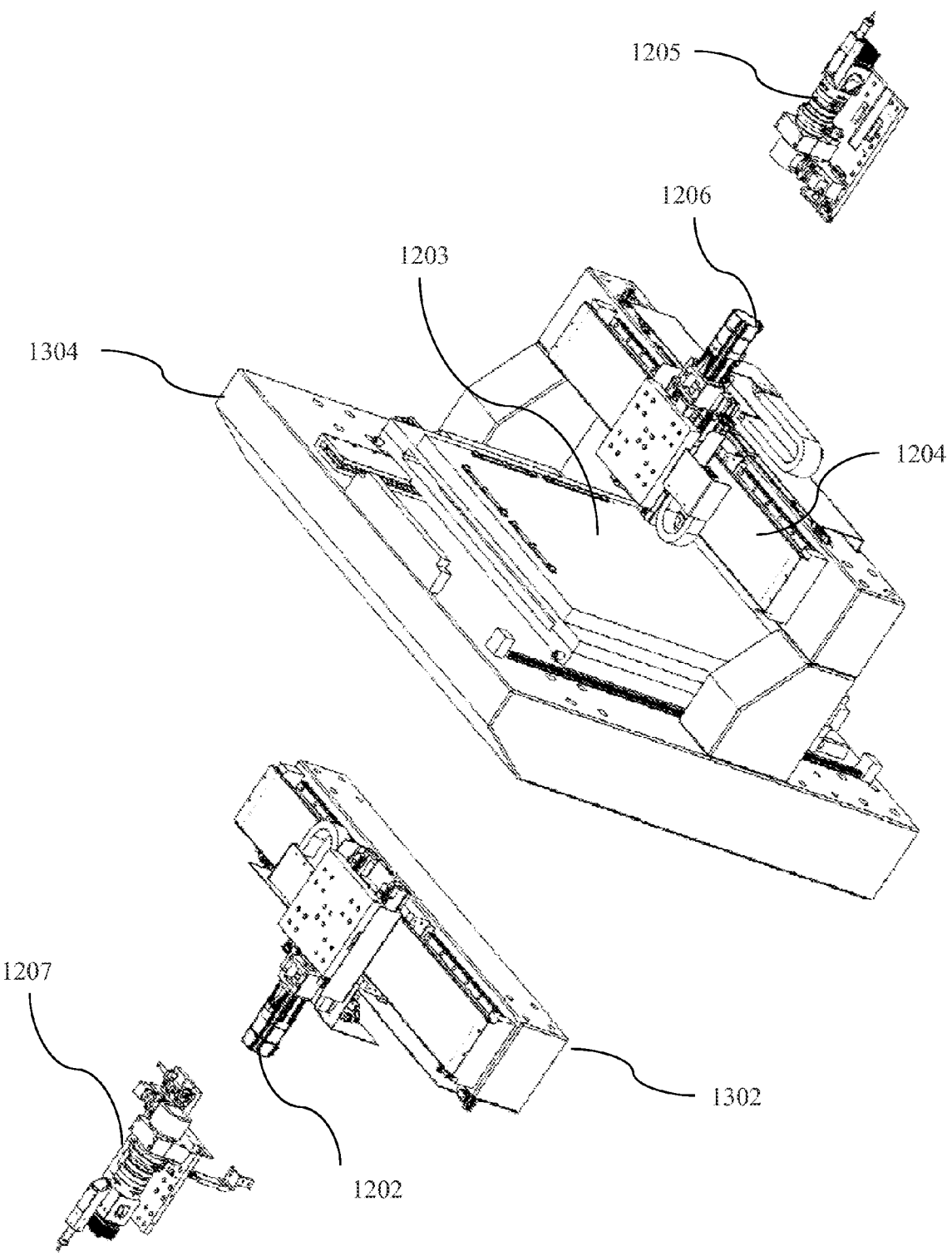
FIG. 14 illustrates a exploded view of FIG. 13.

FIG. 14 is an exploded view of FIG. 13. The maskless optical engine 1205 is mounted on the X1 stage 1204 and Z1 stage 1206 above the Y stage surface plate 1203. The maskless optical engine 1207 is mounted on the X2 1302 and Z2 stage 1202.

Figure 15:
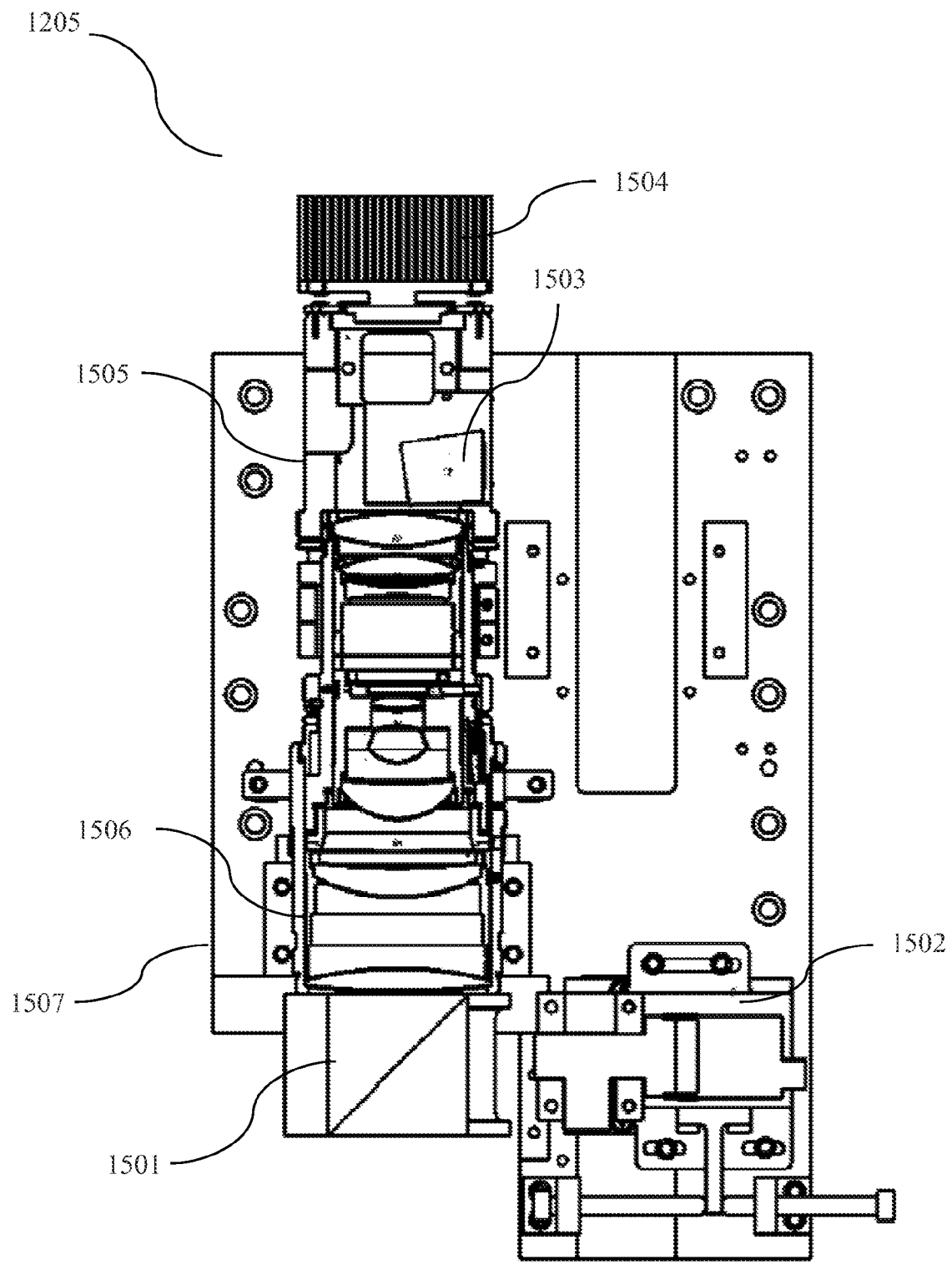
FIG. 15 illustrates a maskless optical engine with a co-axial vision system.
Figure 16:
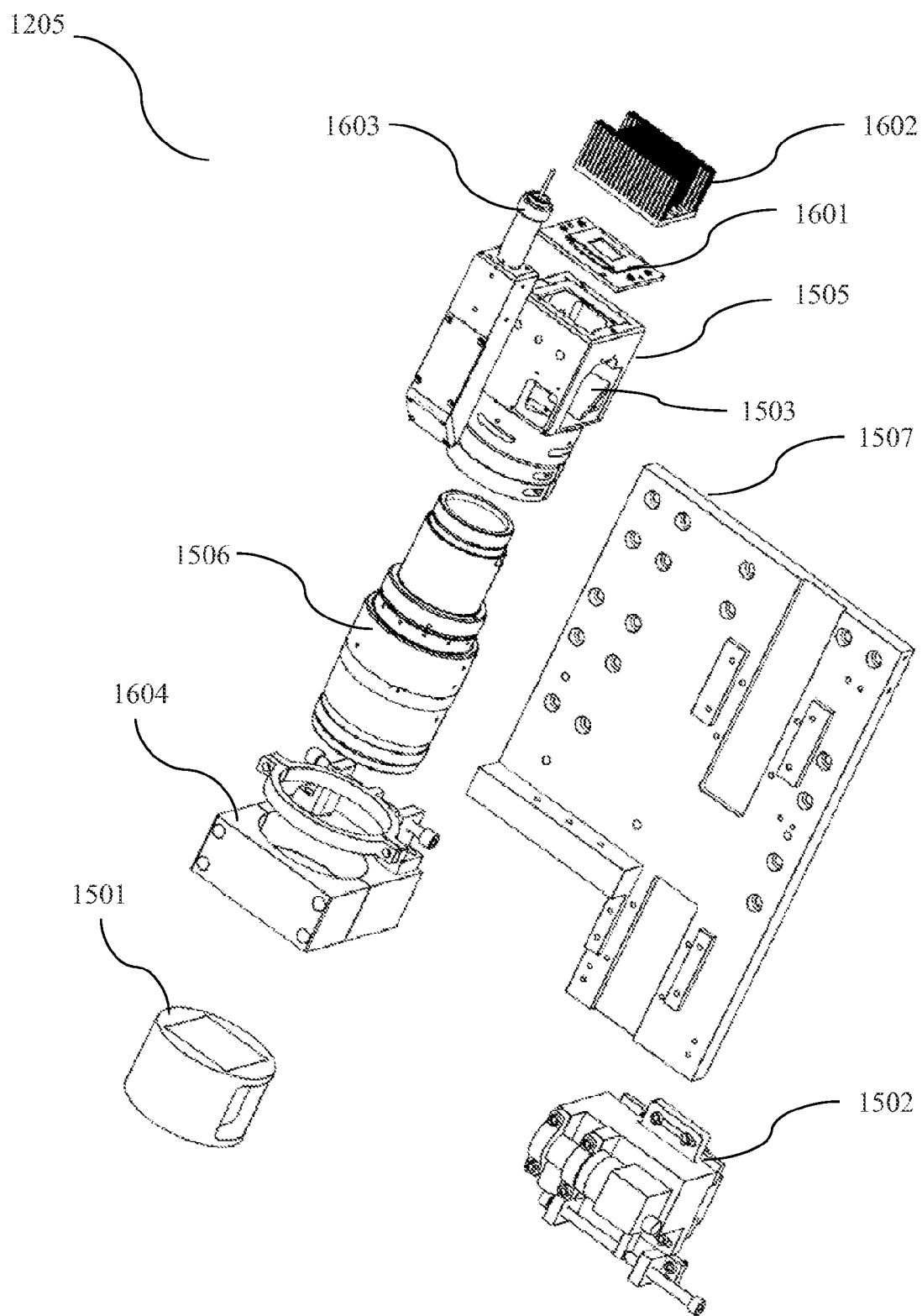
FIG. 16 illustrates a exploded view of FIG. 15.

FIGS. 15 and 16 illustrate the maskless optical engine 1205. The maskless optical engine 1205 includes an optical fiber input port 1603 and a spatial light modulator (in this example a DMD) 1601. The mirror 1503 reflects the light from the optical fiber input port 1603 to the spatial light modulator 1601. The DMD 1601 is mounted to the base of housing 1505 as are the mirror 1503, the optical fiber input and lens system 1506, a heat sink 1602, an optical system 1506, an adjustment mechanism 1604, a beam splitter 1501, a vision system 1502 and a base plate 1507. The optical system 1506 can be a general imaging lens for scaling the spatial light modulator image on a substrate, additionally it can also can be a point array optical system or sub-image array optical system.

Figure 17:
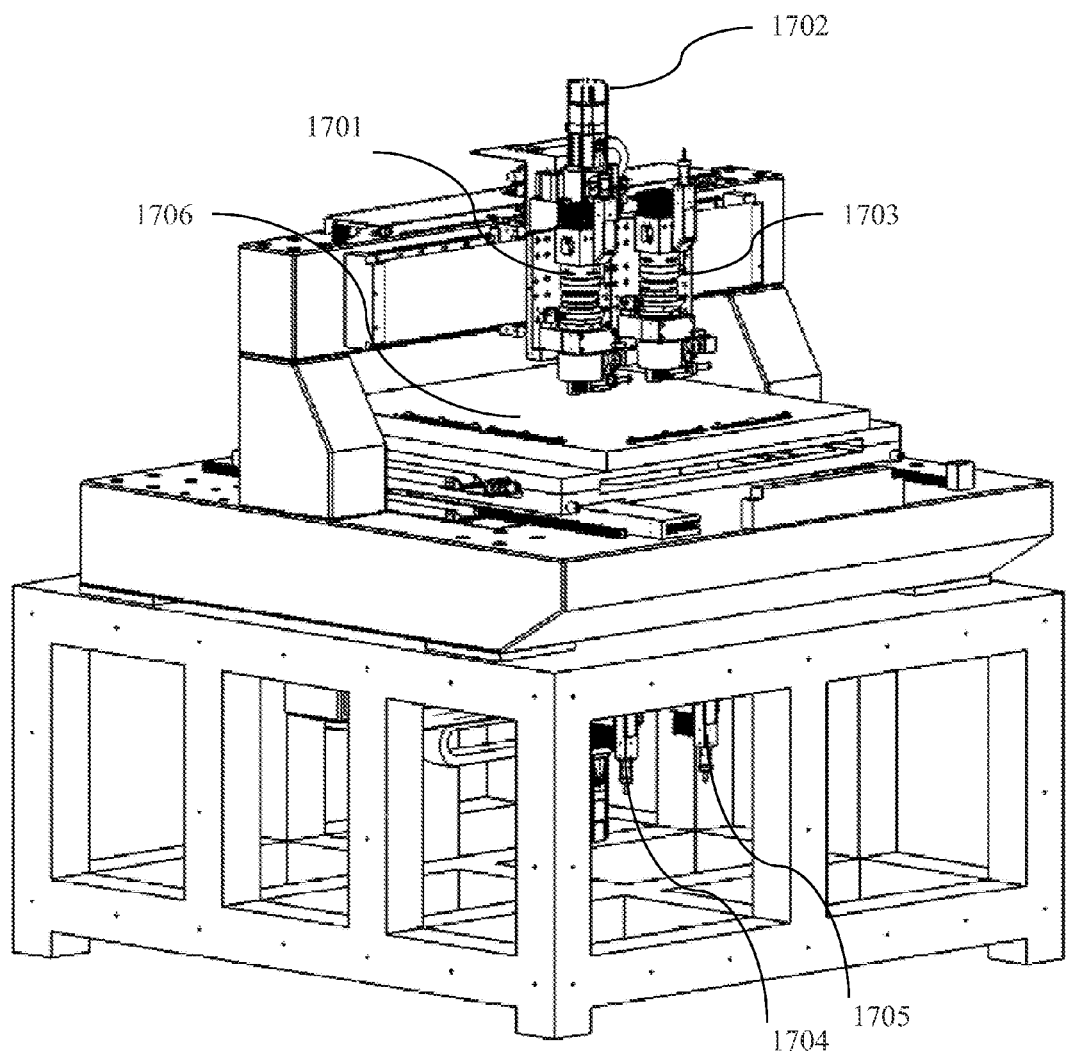
FIG. 17 illustrates a perspective view of a multi-maskless optical engines of the present system.

FIG. 17 shows a multi-optical engine double side maskless exposure system. There are two optical engines 1701,1703, 1704,1705 on the each side of the substrate 1706.

While the apparatus and method been particularly shown and described with reference to the preferred embodiment thereof, it will be understood by those skilled in the art that various modifications, additions and substitutions in form and detail may be made therein without departing form the spirit and scope, as set forth in the following claims.

What is claimed is:

1. A double-sided maskless exposure system comprising:
   a first optical engine for projecting patterns onto a first side of a subject plate;
   a second optical engine for projecting patterns onto a second side of the subject plate;
   a light source generating an input light for said first and second optical engines;
   a first beamsplitter for separating said input light from said light source for said first and second optical engines;
   a vision system for calibration and alignment of said first and second optical engines;
   a computer control system;
   wherein said vision system includes one or more cameras for capturing images of the patterns from said first and second optical engines; and
   said vision system is positioned co-axial with said first and second optical engines; and
   wherein said computer control system is configured to align both optical engines by comparing the patterns captured by said one or more cameras.

2. The system of claim 1 wherein the vision system is used to determine a set of axis positions of said first and second optical engines.

3. The system of claim 1 further comprising a first calibration light source wherein light from said first calibration light source is reflected to the vision system through a second beamsplitter, said first calibration light source having a light wavelength for which a photo sensitive material on the subject plate is insensitive.

4. The system of claim 3 wherein said first calibration light source is positioned between said first beamsplitter and said vision system.

5. The system of claim 3 where said first calibration light source is positioned between said light source and said first optical engine.

6. The system of claim 3 wherein the vision system is used to determine and calibrate a position of the projected pattern from said optical engines on the subject plate by using the light from the first calibration light source.

7. The system of claim 1 wherein said light source further comprising a first exposure light source for the first optical engine and a second exposure light source for the second optical engine.

8. The system of claim 1 wherein said light source further comprising a third exposure light source, wherein said third light source provides light for said first and second optical engines through an optical lens.

9. The system of claim 1 further comprising a spatial light modulator (SLM) for modulating light from said first and second optical engines and a projection system for projecting patterns to said subject plate.

10. The system of claim 9 wherein said first beamsplitter is positioned between said first optical engine and said subject plate.

11. The system of claim 9 wherein said first beamsplitter is positioned between said spatial light modulator and said projection system.

12. The system of claim 9 wherein said projection system includes an lens.

13. The system of claim 9 wherein said projection system includes a point array optical system.

14. The system of claim 9 wherein said projection system includes a sub-image array optical system.

15. The system of claim 3 further comprising a stage system capable of holding and moving the subject plate.

16. The system of claim 3 further comprising a second calibration light source wherein light from a first calibration light source is reflected to the vision system through said second beamsplitter, said first calibration light source having a light wavelength for which a photo sensitive material on the subject plate is insensitive.

17. The system of claim 16 further comprising:
a third beamsplitter for splitting light from the second optical engine; and
a second vision system for receiving light from said third beamsplitter.

18. The system of claim 15 wherein said the stage system is for partial reflection of said first calibration light.

19. The system of claim 18 wherein said computer control system is configured for data processing and synchronizing movements of the optical engines and the stage system.

* * * * *

UNITED STATES PATENT AND TRADEMARK OFFICE
CERTIFICATE OF CORRECTION

PATENT NO. : 8,994,916 B2  
APPLICATION NO. : 13/523924  
DATED : March 31, 2015  
INVENTOR(S) : Wenhui Mei, Weichong Du and Lujie Qu Page 1 of 1

It is certified that error appears in the above-identified patent and that said Letters Patent is hereby corrected as shown below:

Title Page

(73) Assignee information to be included.

Assignee name: Zhongshan Aiscent Technologies, Inc.
Assignee address: #3-1 Mingzhu Road, Torch Development Zone
                     Zhongshan City, Guangdong China 528437

Signed and Sealed this
Fifth Day of July, 2016

Michelle K. Lee
*Director of the United States Patent and Trademark Office*